United States Patent [19]

Horikawa

[11] Patent Number: 5,714,014
[45] Date of Patent: Feb. 3, 1998

[54] SEMICONDUCTOR HETEROJUNCTION MATERIAL

[75] Inventor: Shunji Horikawa, Tokyo, Japan

[73] Assignee: Showa Denko K.K., Tokyo, Japan

[21] Appl. No.: 489,955

[22] Filed: Jun. 13, 1995

[30] Foreign Application Priority Data

Sep. 12, 1994 [JP] Japan ............................ 6-217649
Mar. 27, 1995 [JP] Japan ............................ 7-068297

[51] Int. Cl.$^6$ ............................................ H01L 21/20
[52] U.S. Cl. ........................ 148/33; 148/33.1; 148/33.4; 148/33.5; 148/33.6; 437/105; 437/107; 437/126; 437/129; 437/133
[58] Field of Search .................... 437/105, 107, 437/126, 129, 133; 148/33.4, 33.5, 33.6, 33.1, 33; 117/84

[56] References Cited

U.S. PATENT DOCUMENTS

| | | | |
|---|---|---|---|
| 4,959,839 | 9/1990 | Yamamoto | 372/46 |
| 4,971,928 | 11/1990 | Fuller | 437/129 |
| 4,994,867 | 2/1991 | Biegelsem | 357/16 |
| 5,115,286 | 5/1992 | Camras et al. | 359/19 |
| 5,185,288 | 2/1993 | Cook et al. | 437/133 |
| 5,381,756 | 1/1995 | Kondoh et al. | 117/104 |
| 5,436,466 | 7/1995 | Ko et al. | 257/13 |
| 5,445,897 | 8/1995 | Satoh et al. | 148/33.4 |

OTHER PUBLICATIONS

Asami et al., "Electroreflectance and Pholaluminesence Studies of (AlGa)InPAs lattice Matched to GaAs", Appl. Phyc. Letters, vol. 51(21) pp. 1720–1722, Nov. 23, 1987.
Mukai et al, "Liquid Phase Epitaxial Growth of AlGaInPAs lattice Matched to GaAs" Applied Physics Letters vol. 44(a) pp. 904–906, May 1, 1984.

*Primary Examiner*—Robert Kunemund
*Attorney, Agent, or Firm*—Armstrong, Westerman Hattori, McLeland & Naughton

[57] ABSTRACT

A semiconductor heterojunction material includes a heterojunction configured by successively overlaying first, middle and third layers of semiconductor, some or all of the constituent elements of the first and third layers being different and the middle layer containing all elements contained in the first and third layers.

12 Claims, 5 Drawing Sheets

SEMICONDUCTOR HETEROJUNCTION MATERIAL

BACKGROUND OF THE INVENTION

1. Field of the Invention

This invention relates to a semiconductor heterojunction material usable in optical devices, FET transistors and the like, and more particularly to a semiconductor heterojunction material of a composition which enhances its electrical properties.

2. Description of the Prior Art

Semiconductor heterojunction materials formed by joining different types of semiconductors are used in optical devices such as light emitting diodes (LEDs) and electronic devices such as high-mobility field-effect transistors. The high-mobility field-effect transistor utilizes the two-dimensional electrons which appear at the heterojunction interface between two semiconductors such as GaAs and AlGaAs. The properties of the transistor are enhanced by the high electron mobility produced by the two-dimensional electrons. Many of the excellent properties exhibited by the heterojunction are produced by these interface properties of the heterojunction material and the properties of a device utilizing the heterojunction material are affected by the interface properties.

Heterojunction materials are used not only in electronic devices but also in LEDs, laser diodes (LDs) and other optical devices formed of compound semiconductor materials. The compound semiconductor materials used to constitute the heterojunctions utilized in these compound semiconductor devices include, for example, AlGaAs, GaInP, AlInP and AlGaInP. For instance, a heterojunction configuration constituted of GaInP and AlGaInP has been used as a heterojunction material for a shortwave LED (J. F. Lin et al., Electron. Lett., 29 (1993), 1346).

In the heterojunctions used in LEDs emitting red, orange, yellow or green light, the layers constituting the junction have conventionally been formed of three- or four-element mixed crystals made up of a combination of Al, Ga and/or In falling in group III of the periodic table of elements with P and/or As falling in group V of the same table.

When the prior art heterojunction configurations for LEDs are viewed in terms of electronics, it is found that difference in energy band structure between the semiconductors constituting the junction produces a heterobarrier at the junction interface owing to discontinuity of the conduction band and the valence band. For example, as shown in FIG. 1, when a heterojunction is formed of GaAs 101 having p-type conductivity and AlGaInP 102 also having p-type conductivity, the discontinuity of the valence band 106 at the heterojunction interface 104 forms a spike-like potential barrier (heterobarrier) 103 in the valence band. The conduction band is denoted by 105. This heterobarrier acts as a barrier to motion of the holes which are the carriers of the p-type semiconductor. The heterobarrier thus hinders passage of current therethrough and is therefore a major cause of increased electrical resistance.

A similar phenomenon arises in a heterojunction formed of two semiconductors having n-type conductivity. In this case, the heterobarrier occurs in the conduction band and acts as a barrier to motion of the electrons which are the carriers of the n-type semiconductor.

For obtaining light emission from an LED, voltage is applied between the device electrodes in the forward direction across an LED material such as a heterojunction material. That is to say, voltage is applied so as to make the p-type electrode formed on a p-type semiconductor positive and as to make the n-type electrode formed on an n-type semiconductor negative. Current is ordinarily passed through the heterojunction of an LED in this way. For the foregoing reason, therefore, the effect of the heterobarrier in an LED having a heterojunction appears as an increase in forward voltage.

For realizing an LED with low power consumption and high reliability, it is necessary to lower the forward voltage. This is because a reduction in the forward voltage required for passing a given amount of current lowers power consumption and simultaneously reduces device deterioration by lowering the load on the LED.

In the prior art, the electrical resistance produced by the heterobarrier is reduced by inserting at the junction interface an intermediate (middle) layer consisting of a semiconductor whose band gap is of a magnitude falling midway between those of the two types of semiconductors forming the heterojunction. In the case of the aforementioned heterojunction formed of p-type GaAs and p-type AlGaInP, for example, the practice has been to insert at the junction a middle layer consisting of p-type GaInP, whose band gap is of a magnitude falling between those of GaAs and AlGaInP (K. Itaya et al., Jpn. J. Appl. Phys., 32 (1993), 1919). In this case, the energy band structure at the junction becomes as shown in FIG. 2. As shown in FIG. 2, when an middle layer 107 consisting of GaInP is inserted, heterobarriers 103 are formed both at the heterojunction interface 104 between the p-type GaAs layer 101 and the middle layer 107 and at the heterojunction interface 104 between the middle layer 107 and the p-type AlGaInP layer 102. The magnitude of each heterobarrier 103 is smaller than would be the case if the middle layer 107 were not inserted. This method thus enables the electrical resistance of the heterojunction material to be reduced to some degree.

Since this prior art method results in the presence of heterobarriers at two locations, however, the reduction in electrical resistance is insufficient. A further reduction of the electrical resistance of the heterojunction is therefore necessary for obtaining a high-performance LED comprising a heterojunction material.

In this regard, it is easy to see that the electrical resistance can be further reduced if the heterobarrier is subdivided by inserting a number of middle layers consisting of semiconductors with band gap magnitudes different from each other but falling between those of the two types of semiconductors forming the heterojunction and arranging these middle layers in the order of their band gap magnitudes. In practice, however, it is not easy to find a combination of semiconductors with appropriate band gaps.

The object of this invention is therefore to provide a semiconductor heterojunction material based on a new heterojunction configuration and able to reduce the large electrical resistance component appearing in the current-voltage characteristic of a heterojunction material.

SUMMARY OF THE INVENTION

This invention achieves this object by providing a semiconductor heterojunction material including a heterojunction configured by successively overlaying first, middle and third layers of semiconductors, some or all of the constituent elements of the first and third layers being different and the middle layer containing all elements contained in the first and third layers. Specifically, the semiconductor heterojunction material according to this invention consists in providing a middle layer of AlGaInPAs in a heterojunction constituted of GaAs and AlGaInP, GaAs and AlInP, AlGaAs and AlGaInP or AlGaAs and AlInP.

When the middle layer is constituted in this way as a layer containing all of the constituent elements of the semiconductors forming the heterojunction configuration, the band gap of the semiconductor forming the middle layer can be set to a desired value falling between the band gaps of the other two types of semiconductors forming the heterojunction. As a result, increase in the electrical resistance produced by the heterobarrier can be suppressed.

The above and other objects, characteristic features and advantages of this invention will become apparent to those skilled in the art from the description of the invention given hereinbelow with reference to the accompanying drawings.

DESCRIPTION OF THE PREFERRED EMBODIMENTS

Figure 1:
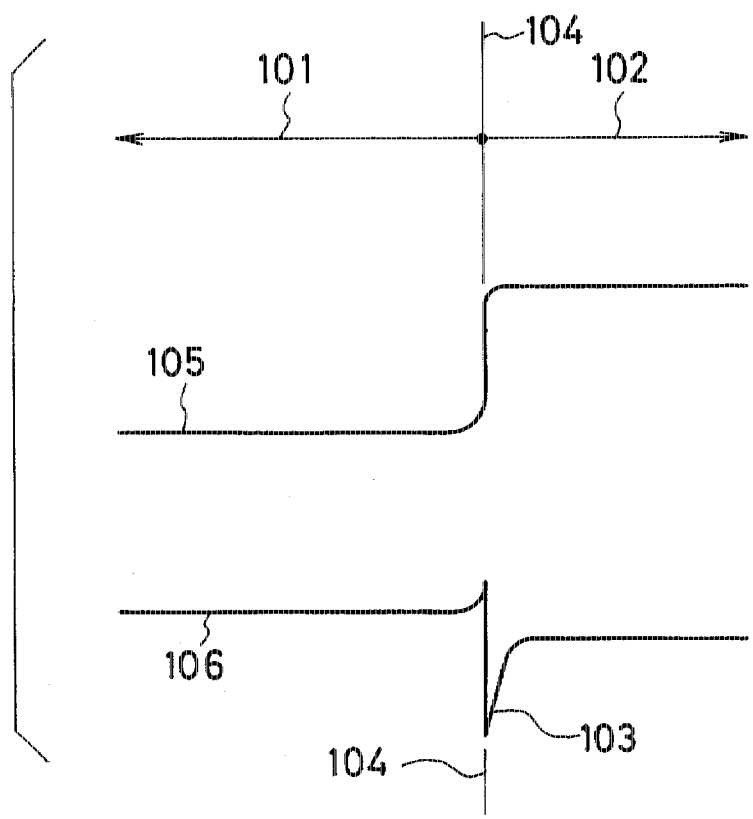
FIG. 1 is a diagram showing the energy band structure of an ordinary semiconductor heterojunction.
Figure 2:
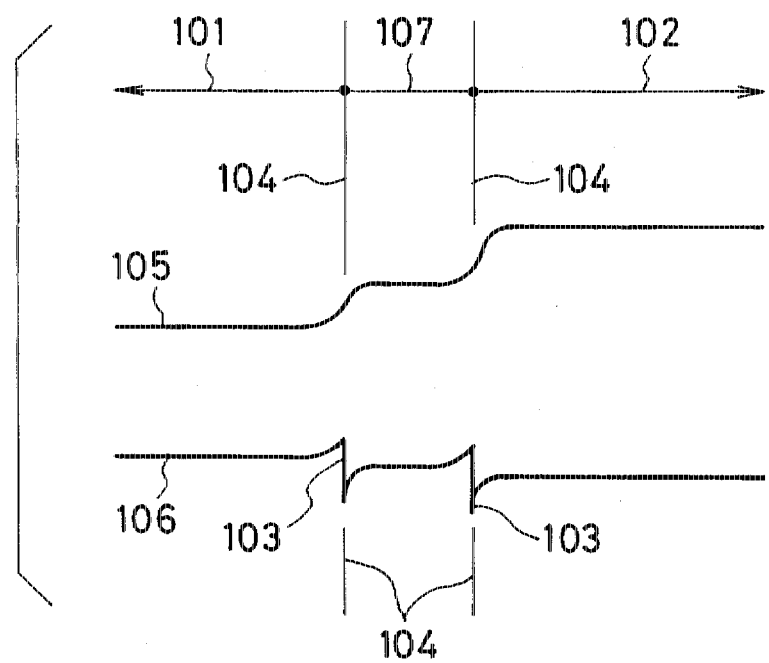
FIG. 2 is a diagram showing the energy band structure of an improved prior art semiconductor heterojunction.

In the semiconductor heterojunction material according to this invention formed by successively overlaying first, middle and third layers of semiconductors, some or all of the constituent elements of the first and third layers are different and the middle layer contains all elements contained in the first and third layers. More specifically, by structuring the heterojunction of a combination of GaAs and AlGaInP, GaAs and AlInP, AlGaAs and AlGaInP or AlGaAs and AlInP and interposing a layer consisting of AlGaInPAs between the junction layers, it is possible to provide a semiconductor heterojunction material including a heterojunction which suppresses increase in the electrical resistance produced by the heterobarrier.

Moreover, the effect of the invention is further enhanced when the middle layer is continuously or stepwise graded in elemental composition between its heterojunction interface with one of the first and third layers and its heterojunction interface with the other thereof.

The stacked configuration of three types of semiconductors constituting the heterojunction can be located anywhere within the material.

The semiconductor material of the middle layer includes all constituent elements of the semiconductors forming the heterojunction. For instance, in a heterojunction configuration constituted of GaAs (made up of Ga and As) and AlGaInP four-element mixed crystal (made up of Al, Ga, In and P), the heterojunction structure includes the five elements Al, Ga, In, P and As. The middle layer is therefore constituted of AlGaInPAs five-element mixed crystal. The middle layer is constituted of all constituent elements of the semiconductors forming the heterojunction configuration because this enables the composition of the middle layer to be controlled so as to adjust the band gap of the semiconductor constituting the middle layer to a desired magnitude falling between the band gap magnitudes of the two types of semiconductors forming the heterojunction.

The procedure for interposing the middle layer between the two types of semiconductors forming the heterojunction will now be explained. For example, a GaAs layer is first deposited on a GaAs single crystal substrate. Next, an AlGaInPAs layer is formed on the GaAs layer. The composition of the AlGaInPAs will be represented by the formula $Al_X Ga_Y In_Z P_U As_W$, wherein X, Y, Z, U and W are the content ratios of the respective elements and are stoichiometrically defined such that $X+Y+Z=1$ and $U+W=1$. At the time of depositing the AlGaInPAs, if the composition is controlled so that the In and P constituents, i.e., Z and U in the forgoing notation, satisfy the relationship $Z=U/2$ in the AlGaInPAs layer, the AlGaInPAs layer will be substantially lattice matched with the GaAs, enabling formation of a layer with good crystallinity. Following this, AlInP is deposited on the AlGaInPAs layer. The composition of the AlInP will be represented by the formula $Al_S In_T P$, wherein S and T are the content ratios of Al and In and are stoichiometrically defined such that $S+T=1$. Since the AlInP layer substantially lattice matches with the GaAs layer when $S=T=0.5$, an AlInP layer with excellent crystallinity is easy to obtain when the composition is in the vicinity of this relationship. The successive deposition of layers in this manner provides a heterojunction material consisting of three layers, a GaAs layer, an AlInP layer and an AlGaInPAs layer, and including the AlGaInPAs as the middle layer. The deposition can be conducted by molecular beam epitaxy (MBE), metalloorganic chemical vapor deposition (MOCVD) or the like.

The composition of the AlGaInPAs five-element mixed crystal is preferably graded stepwise or continuously in the direction of deposition of the middle layer. This enables the magnitude of the band gap of the middle layer to be varied stepwise or continuously between one substantially equal to that of one of the semiconductors of the heterojunction to one substantially equal to that of the other semiconductor thereof. The provision of the middle layer with this type of composition gradient suppresses the formation of a heterobarrier such as occurs in the prior art heterojunction configuration owing to large band gap discontinuity and thus overcomes the problem of increased electrical resistance produced by the heterobarrier.

Figure 3:
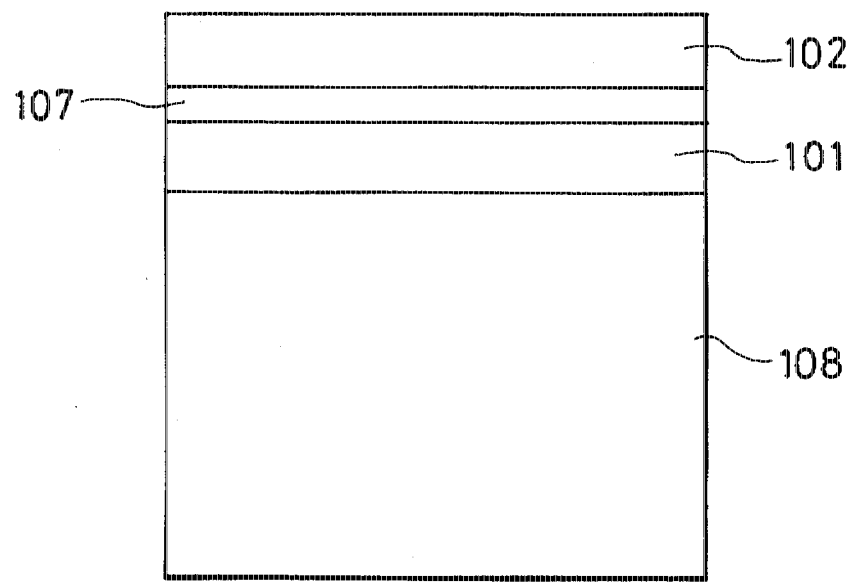
FIG. 3 is a view for explaining the structure of a semiconductor heterojunction according to the invention.

FIG. 3 schematically illustrates an example of a GaAs and AlGaInP heterojunction configuration provided with an AlGaInPAs middle layer according to the invention. In the example of FIG. 3, the heterojunction is formed on a p-type GaAs substrate 108. A middle layer 107 formed of p-type AlGaInPAs is interposed between a p-type GaAs layer 101 and a p-type AlGaInP layer 102 which are the constituent elements of the heterojunction.

The preferred manner of varying the composition of the elements of the AlGaInPAs when the middle layer is to be continuously graded will now be considered. AlGaInPAs can be considered to be a mixture of GaAs and AlGaInP. Thus when the content ratios of the elements constituting the AlGaInPAs are converted to content ratios of GaAs and AlGaInP in a mixture of these constituting the middle layer 107, it follows that the GaAs content should be continuously varied from 1 to 0 and the AlGaInP content from 0 to 1 between the interface of the middle layer 107 with the p-type GaAs layer 101 and its interface thereof with the p-type AlGaInP layer 102. When this is done, the magnitude of the band gap of the AlGaInPAs middle layer 107 continuously varies between the magnitude of the band gap of GaAs and the magnitude of the band gap of AlGaInP.

Figure 4:
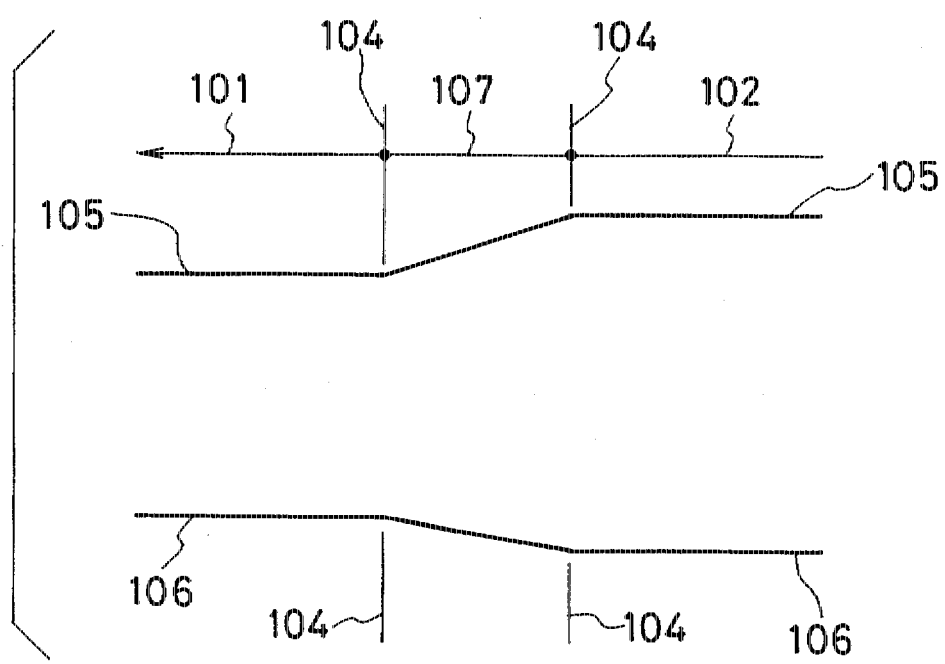
FIG. 4 is a diagram for explaining an example of the energy band structure of the semiconductor heterojunction according to the invention.

FIG. 4 shows the energy band structure in the case where an AlGaInPAs middle layer is provided in a GaAs/AlGaInP heterojunction configuration. The diagram of FIG. 4 is for the foregoing case in which the composition of the middle layer is varied continuously. The GaAs layer, AlGaInPAs middle layer and AlGaInP layer all have p-type conductivity. Since the band gap of the AlGaInPAs middle layer varies continuously owing to the aforesaid continuously graded composition of the middle layer between its interface with the GaAs and its interface with the AlGaInP, the heterobarrier occurring in the prior art hetero-interface is avoided.

The composition of the middle layer can also be varied stepwise. In a GaAs/AlGaInP heterojunction configuration, for example, the band gap can be varied stepwise by depositing in appropriate order a plurality of thin AlGaInPAs sublayers of different compositions and, accordingly, different band gaps. For instance, it suffices to deposit a number of thin AlGaInPAs sublayers with progressively higher band gaps between the GaAs side and the AlGaInP side. The invention does not particularly specify the thickness of the deposited layers or the number thereof.

Figure 5:
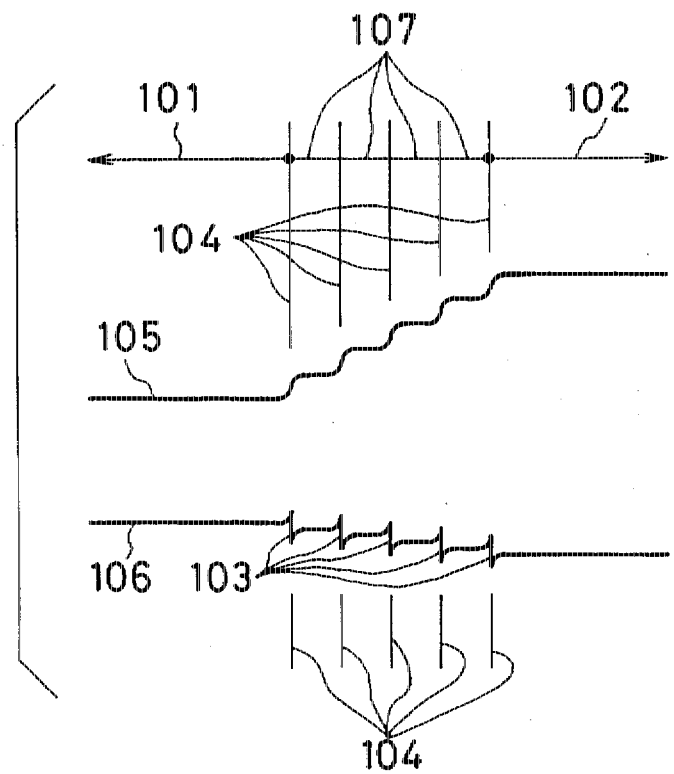
FIG. 5 is a diagram for explaining another example of the energy band structure of the semiconductor heterojunction according to the invention.

FIG. 5 shows the energy band structure in the case where an AlGaInPAs middle layer of stepwise varied composition is provided in a GaAs/AlGaInP heterojunction configuration. The diagram of FIG. 5 is for the case in which the middle layer is formed of thin sublayers of AlGaInPAs having compositions varied in four steps. The GaAs layer, the AlGaInPAs middle layer and the AlGaInP layer all have p-type conductivity. Since the composition of the AlGaInPAs middle layer 107 is varied in four steps between the interface with the GaAs and the interface with the AlGaInP, the band gap of the middle layer 107 varies stepwise. As a result, the heterobarrier occurring at the single hetero-interface in the prior art is divided among five locations. Since the magnitudes of the heterobarriers at the individual hetero-interface are therefore smaller than that at the hetero-interface in the prior art, the electrical resistance at the heterojunction can be greatly reduced. The composition does not have to be varied in four steps. Semiconductors having appropriate band gaps can easily be obtained by adjusting the composition of the AlGaInPAs middle layer according to the present invention.

Although the heterojunction is constituted of semiconductors having p-type conductivity in the foregoing examples, it can be constituted of semiconductors having either p-type or n-type conductivity. However, the invention relates to a semiconductor heterojunction material effective in the case of heterojunction between p-type semiconductors or between n-type semiconductors and does not apply to a heterojunction between a p-type semiconductor and an n-type semiconductor. The invention does not particularly specify the thickness of the deposited layers of semiconductors constituting the heterojunction or the carrier concentration thereof. Moreover, since the invention is directed to the properties of the heterojunction interface, it does not particularly specify the thickness or carrier concentration of the middle layer. It suffices for the conductivity type of the middle layer to be the same as that of the semiconductors constituting the heterojunction.

Since differently from in the prior art no sudden change in band gap occurs between the semiconductors constituting the heterojunction, the formation of a heterobarrier at the heterojunction is suppressed, thus eliminating the cause for increase in electrical resistance.

The present invention will now be explained based on specific working examples.

EXAMPLE 1

Figure 6:
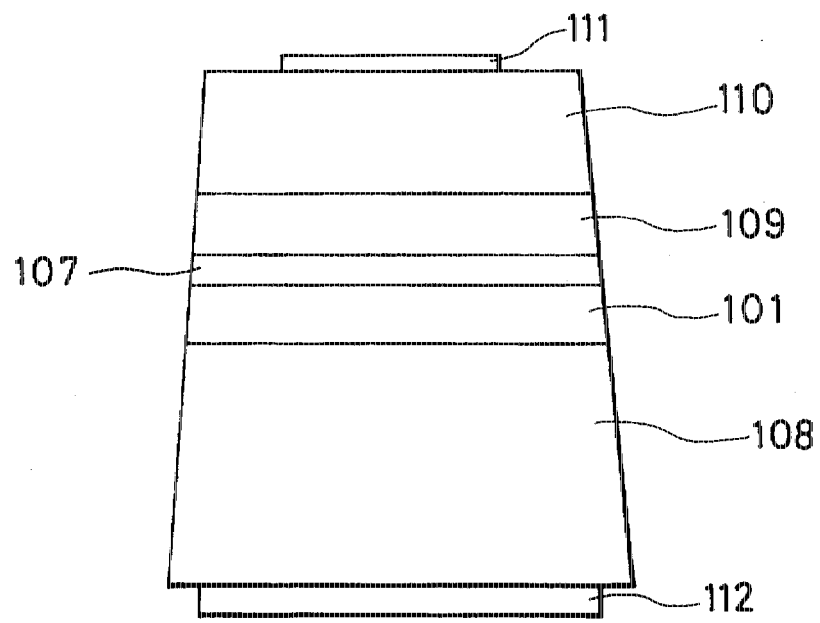
FIG. 6 is a schematic view of an LED comprising a semiconductor heterojunction material which is a first working example of the invention.

FIG. 6 shows an LED comprising a semiconductor heterojunction material which is a first working example of the invention. As shown in the schematic sectional view of FIG. 6, the heterojunction configuration was formed of GaAs and AlGaInP and had an intervening middle layer of AlGaInPAs. In this example the GaAs served as a buffer layer of the LED and the AlGaInP as the light emitting layer thereof.

The heterojunction material was formed on a single crystal p-type GaAs substrate 108 doped with Zn. A Zn-doped p-type GaAs layer 101 was deposited on the p-type GaAs substrate 108 as a buffer layer. The p-type GaAs layer 101 was formed to have a thickness of about $1 \times 10^{-4}$ cm and a carrier concentration of about $2 \times 10^{18}$ cm$^{-3}$.

A p-type AlGaInPAs layer doped with Zn was formed on the p-type GaAs layer 101 as a middle layer 107. The middle layer was formed to a thickness of approximately $2 \times 10^{-5}$ cm. The carrier concentration of the middle layer 107 was held within the range of approximately $1 \times 10^{17}$ cm$^{-3}$ and $2 \times 10^{18}$ cm$^{-3}$.

Again representing the composition of the AlGaInPAs middle layer 107 as $Al_XGa_YIn_ZP_UAs_W$, the values of the subscripts were to set at Y=W=1 and X=Z=U=0 at the junction interface with the p-type GaAs layer 101 and as X=0.25, Y=0.25, Z=0.5, U=1 and W=0 at the junction interface with a p-type AlGaInP light emitting layer 109. In other words, the constituent elements of the middle layer 107 were graded from the junction interface with the GaAs layer 101 to the interface with the p-type AlGaInP light emitting layer 109 such that the Al component continuously varied from 0 to 0.25, the Ga component from 1 to 0.25, the In component from 0 to 0.5, the As component from 1 to 0 and the P component from 0 to 1. As a result, the middle layer 107 contained all five elements of the GaAs and AlGaInP constituting the heterojunction.

The p-type AlGaInP layer 109 was deposited on the middle layer 107 as a light emitting layer. Representing the composition of the AlGaInP layer 109 as $Al_kGa_lIn_mP$, the values of the subscripts were set at k=l=0.25 and m=0.5. This composition matches the composition of the middle layer 107 on the side of its interface with the p-type AlGaInP light emitting layer 109. As a result, the band gap of the AlGaInP layer 109 was about 2.2 eV at room temperature. Its carrier concentration was adjusted to about $6 \times 10^{16}$ cm$^{-3}$ by doping with Zn and its thickness was $1 \times 10^{-4}$ cm.

An n-type AlGaInP layer 110 was deposited on the p-type AlGaInP light emitting layer 109 to a thickness of $3 \times 10^{-4}$ cm and was doped with Se to have a carrier concentration of about $1 \times 10^{18}$ cm$^{-3}$. Representing the composition of the n-type AlGaInP layer 110 as $Al_kGa_lIn_mP$, the values of the subscripts were set at k=0.3, l=0.2 and m=0.5.

An n-type electrode 111 was formed on the n-type AlGaInP layer 110 and a p-type electrode 112 was formed on the bottom surface of the p-type GaAs substrate 108, thus completing the fabrication of an LED for emitting green light.

The LED emitted green light of a wavelength in the vicinity of 560 nm when a forward voltage was applied between the electrodes 111 and 112. In this LED comprising the heterojunction material according to the invention, the forward voltage required for producing a 5 mA operating current between the electrodes was not more than about 2.2 V. In contrast, a forward voltage of about 8 V was required for producing a 5 mA current from the p side electrode to the n side electrode of a prior art LED comprising a GaAs/AlGaInP heterojunction having no AlGaInPAs middle layer. The superiority of the semiconductor heterojunction material according to the invention was thus verified.

EXAMPLE 2

Figure 7:
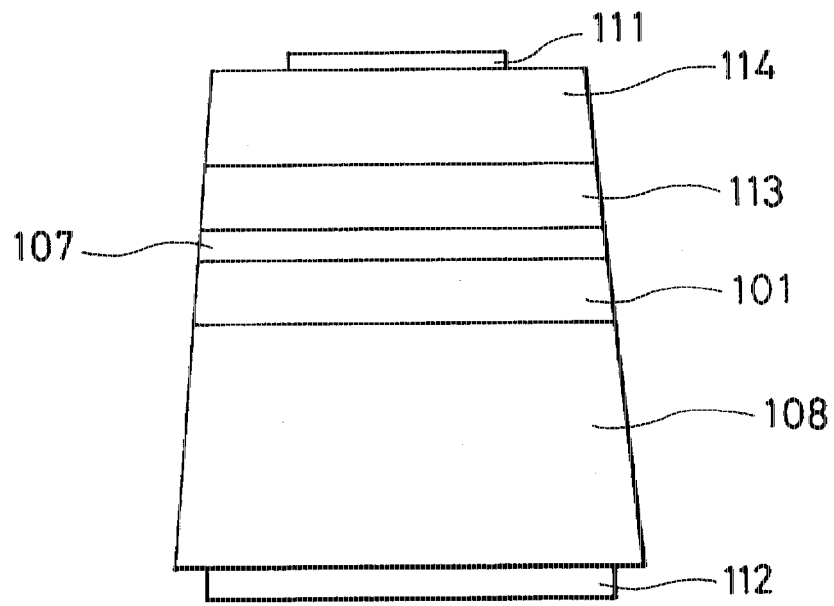
FIG. 7 is a schematic view of an LED comprising a semiconductor heterojunction material which is a second working example of the invention.

FIG. 7 shows an LED comprising a semiconductor heterojunction material which is a second working example of the invention. As shown in the schematic sectional view of FIG. 7, the heterojunction configuration was formed of GaAs and AlInP and had an intervening middle layer of AlGaInPAs.

The p-type GaAs substrate 108 and the p-type GaAs layer 101 were the same as those in the first example.

A Zn-doped p-type AlGaInPAs layer was deposited on the p-type GaAs layer 101 as a middle layer 107. The thickness and carrier concentration of the middle layer 107 were the same as in Example 1.

Representing the composition of the AlGaInPAs middle layer 107 as $Al_XGa_YIn_ZP_UAs_W$, the values of the subscripts were to set at Y=W=1 and X=Z=U=0 at the junction interface with the p-type GaAs layer 101 and as X=0.5, Y=0, Z=0.5, U=1 and W=0 at the junction interface with a p-type AlInP layer 113. In other words, the constituent elements of the middle layer 107 were graded from the junction interface with the p-type GaAs layer 101 to the interface with the p-type AlInP layer 113 such that the Al component continuously varied from 0 to 0.5, the Ga component from 1 to 0, the In component from 0 to 0.5, the As component form 1 to 0 and the P component from 0 to 1. As a result, the middle layer 107 contained all five elements of the GaAs and AlInP constituting the heterojunction.

The p-type AlInP layer 113 was deposited on the middle layer 107. Representing the composition of the p-type AlInP layer 113 as $Al_SIn_TP$, the values of the subscripts were set at S=T=0.5. This composition is the same as the composition of the AlGaInPAs middle layer 107 on the side of its interface with the p-type AlInP layer 113. The carrier concentration of the p-type AlInP layer 113 was adjusted to about $6 \times 10^{16}$ cm$^{-3}$ by doping with Zn and its thickness was about $1 \times 10^{-4}$ cm.

An n-type AlGaInP layer 114 was deposited on the p-type AlInP layer 113 as a light emitting layer. The n-type AlGaInP light emitting layer 114 was formed to a thickness of $1.5 \times 10^{-4}$ cm and was doped with Se to have a carrier concentration of about $1 \times 10^{17}$ cm$^{-3}$. Representing the composition of the n-type AlGaInP light emitting layer 114 as $Al_kGa_lIn_mP$, the values of the subscripts were set at k=l=0.25 and m=0.5. The band gap of the n-type AlGaInP light emitting layer 114 was about 2.2 eV at room temperature.

An n-type electrode 111 was formed on the n-type AlGaInP light emitting layer 114 and a p-type electrode 112 was formed on the bottom surface of the p-type GaAs substrate 108, thus completing the fabrication of an LED for emitting green light.

The LED emitted green light of a wavelength in the vicinity of 560 nm when a forward voltage was applied between the electrodes 111 and 112. In this LED comprising the heterojunction material according to the invention, the forward voltage required for producing a 5 mA operating current between the electrodes was not more than about 2.2 V. In contrast, a forward voltage of about 15 V was required for producing a 5 mA current from the p side electrode to the n side electrode of a prior art LED comprising a GaAs/AlInP heterojunction having no AlGaInPAs middle layer. The superiority of the semiconductor heterojunction material according to the invention was thus verified.

EXAMPLE 3

Figure 8:
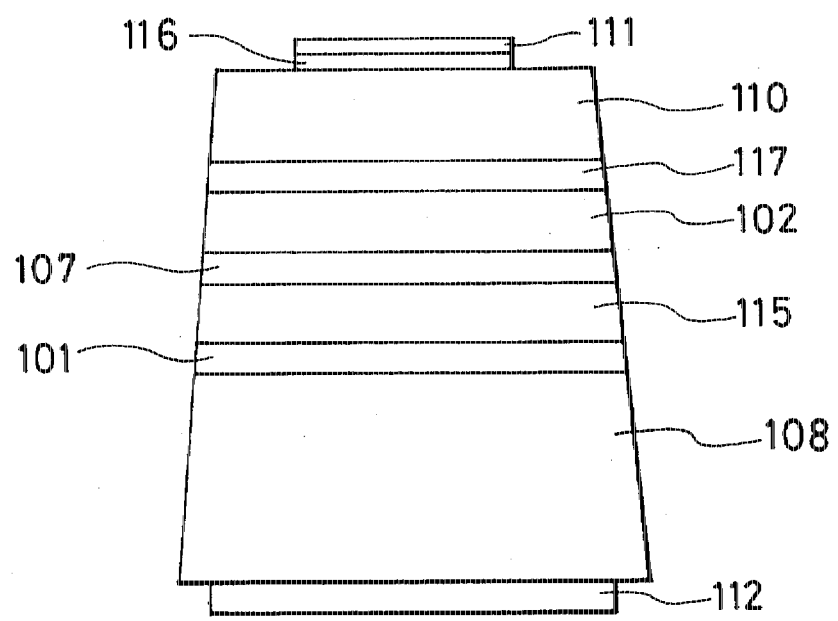
FIG. 8 is a schematic view of an LED comprising a semiconductor heterojunction material which is a third working example of the invention.

FIG. 8 shows an LED comprising a semiconductor heterojunction material which is a third working example of the invention. As shown in the schematic sectional view of FIG. 8, the heterojunction configuration was formed of AlGaAs and AlGaInP and had an intervening middle layer of AlGaInPAs.

The p-type GaAs substrate 108 was the same as that in the first example. A Zn-doped p-type GaAs layer 101 was deposited on the p-type GaAs substrate 108 as a buffer layer. The thickness of the GaAs layer 101 was $5 \times 10^{-5}$ and its p-type carrier concentration was adjusted to $2 \times 10^{18}$ cm$^{-3}$ by addition of Zn.

A Bragg reflecting layer 115 consisting of p-type AlGaAs was formed on the p-type GaAs layer 101 by alternately overlaying semiconductor layers with different indices of refraction. This p-type AlGaAs Bragg reflecting layer 115 was formed of layers of AlGaAs with an Al content of 0.4 and a Ga content of 0.6 (layers A) and layers of AlGaAs with an Al content of 0.95 and a Ga content of 0.05 (layers B). Thirteen such layers were laminated alternately in the manner of A layer----B layer----A layer----B layer, with an A layer as the ending layer.

The p-type AlGaAs Bragg reflecting layer 115 had a thickness of $1.2 \times 10^{-4}$ cm and was adjusted to a carrier concentration of $2 \times 10^{18}$ cm$^{-3}$ by doping with Zn.

A p-type AlGaInPAs layer doped with Zn was formed on the p-type AlGaAs Bragg reflecting layer 115 as a middle layer 107. The thickness and carrier concentration of the middle layer 107 were the same as in the first Example.

Representing the composition of the middle layer 107 as $Al_XGa_YIn_ZP_UAs_W$, the values of the subscripts were to set at X=0.4, Y=0.6, W=1 and Z=U=0 at the junction interface with the p-type AlGaAs Bragg reflecting layer 115 and as X=0.35, Y=0.15, Z=0.5, U=1 and W=0 at the interface with a p-type AlGaInP layer 102. In other words, the constituent elements of the middle layer 107 were graded from the junction interface with the p-type AlGaAs Bragg reflecting layer 115 to the interface with the p-type AlGaInP layer 102 such that the Al component continuously varied from 0.4 to 0.35, the Ga component from 0.6 to 0.15, the In component from 0 to 0.5, the As component from 1 to 0 and the P component from 0 to 1. As a result, the middle layer 107 contained all five elements of the AlGaAs and AlGaInP constituting the heterojunction.

The p-type AlGaInP layer 102 was deposited on the middle layer 107. Representing the composition of the p-type AlGaInP layer 102 as $Al_kGa_lIn_mP$, the values of the subscripts were set at k=0.35, l=0.15 and m=0.5. This composition matches the composition of the middle layer 107 on the side of its interface with the p-type AlGaInP layer 102. As a result, the band gap of the p-type AlGaInP layer 102 was about 2.3 eV at room temperature. Its carrier concentration was adjusted to about $1\times10^{17}$ cm$^{-3}$ by doping with Zn and its thickness was $1\times10^{-4}$ cm.

An AlGaInP active layer 117 was deposited on the p-type AlGaInP layer 102. Representing the composition of AlGaInP active layer 117 as $Al_kGa_lIn_mP$, the values of the subscripts were set at k=0.25, l=0.25 and m=0.5. As a result, the band gap of the AlGaInP active layer 117 was about 2.2 eV at room temperature. Its carrier concentration was adjusted to about $5\times10^{16}$ cm$^{-3}$ by doping with Zn and its thickness was $8\times10^{-5}$ cm.

An n-type AlGaInP layer 110 was deposited on the AlGaInP active layer 117. Representing the composition of the n-type AlGaInP layer 110 as $Al_kGa_lIn_mP$, the values of the subscripts were set at k=0.35, l=0.15 and m=0.5. As a result, the band gap of the n-type AlGaInP layer 110 was about 2.3 eV at room temperature. Its carrier concentration was adjusted to about $1\times10^{18}$ cm$^{-3}$ by doping with Se and its thickness was $3\times10^{-4}$ cm.

An n-type GaAs layer 116 was deposited on the n-type AlGaInP layer 110. The n-type GaAs layer 116 was provided for reducing the contact resistance of an n-type electrode provided thereon. The carrier concentration of the n-type GaAs layer 116 was adjusted to $1\times10^-$cm$^{-3}$ by doping with Se and its thickness was $3\times10^{-5}$ cm.

An n-type electrode 111 was formed on the n-type GaAs layer 116 and a p-type electrode 112 was formed on the bottom surface of the p-type GaAs substrate 108, thus completing the fabrication of an LED for emitting green light. At the time of LED fabrication, all of the n-type GaAs layer 116 other than the part thereof immediately under the n-type electrode 111 was removed by etching so as to enable output of light from the AlGaInP active layer 117.

The LED emitted green light of a wavelength in the vicinity of 560 nm when a forward voltage was applied between the electrodes 111 and 112. In this LED comprising the heterojunction material according to the invention, the forward voltage required for producing a 5 mA operating current between the electrodes was not more than about 2.0 V. In contrast, a forward voltage of about 2.5 V was required for producing a 5 mA current from the p side electrode to the n side electrode of a prior art LED comprising an AlGaAs/AlGaInP heterojunction having no AlGaInPAs middle layer. The superiority of the semiconductor heterojunction material according to the invention was thus verified.

EXAMPLE 4

Figure 9:
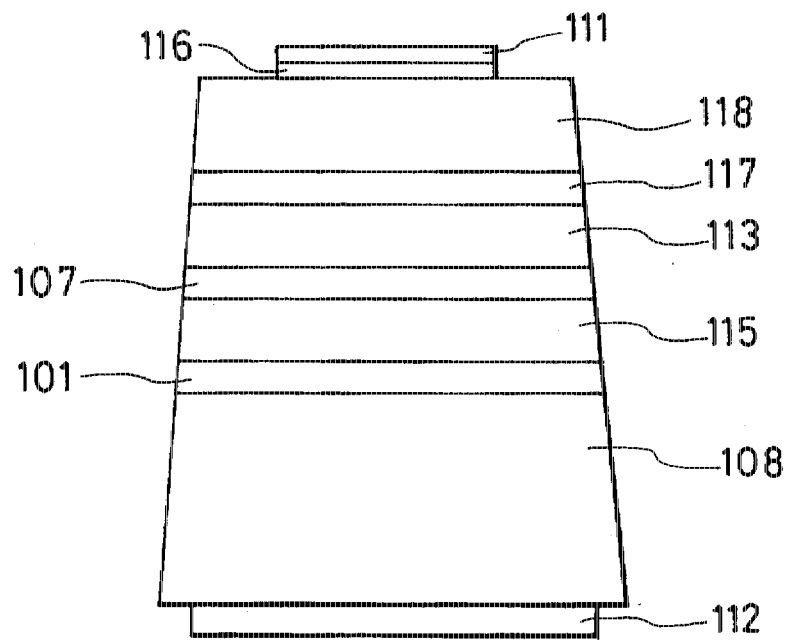
FIG. 9 is a schematic view of an LED comprising a semiconductor heterojunction material which is a fourth working example of the invention.

FIG. 9 shows an LED comprising a semiconductor heterojunction material which is a fourth working example of the invention. As shown in the schematic sectional view of FIG. 9, the heterojunction configuration was formed of AlGaAs and AlInP and had an intervening middle layer of AlGaInPAs.

The p-type GaAs substrate 108 was the same as in Example 1. As in Example 3, a p-type GaAs layer 101 and a p-type AlGaAs Bragg reflecting layer 115 were deposited on the substrate 108.

A p-type AlGaInPAs layer doped with Zn was formed on the p-type AlGaAs Bragg reflecting layer 115 as a middle layer 107. The thickness and carrier concentration of the middle layer 107 were the same as in Example 1.

Representing the composition of the middle layer 107 as $Al_xGa_yIn_zAs_w$, the values of the subscripts were to set at X=0.4, Y=0.6, W=1 and Z=U=0 at the junction interface with the p-type AlGaAs Bragg reflecting layer 115 and as X=0.5, Y=0, Z=0.5, U=1 and W=0 at the interface with a p-type AlInP layer 113. In other words, the constituent elements of the middle layer 107 were graded from the junction interface with the p-type AlGaAs Bragg reflecting layer 115 to the interface with the p-type AlInP layer 113 such that the Al component continuously varied from 0.4 to 0.5, the Ga component from 0.6 to 0, the In component from 0 to 0.5, the As component from 1 to 0 and the P component from 0 to 1. As a result, the middle layer 107 contained all five elements of the AlGaAs and AlInP constituting the heterojunction.

As in Example 2, a p-type AlInP layer 113 was deposited on the middle layer 107. Representing the composition of the p-type AlInP layer 113 as $Al_sIn_tP$, the values of the subscripts were set at S=T=0.5. This composition is the same as the composition of the middle layer 107 on the side of its interface with the p-type AlInP layer 113. The carrier concentration and thickness of the p-type AlInP layer 113 were the same as in Example 2.

Similarly to in Example 3, an AlGaInP active layer 117 was deposited on the p-type AlInP layer 113. Representing the composition of AlGaInP active layer 117 as $Al_kGa_lIn_mP$, the values of the subscripts were set at k=0.25, l=0.25 and m=0.5. As a result, the band gap of the AlGaInP active layer 117 was about 2.2 eV at room temperature. Its carrier concentration was adjusted to about $5\times10^{16}$ cm$^{-3}$ by doping with Zn and its thickness was $8\times10^{-5}$ cm.

An n-type AlInP layer 118 was deposited on the AlGaInP active layer 117. Representing the composition of the n-type AlInP layer 118 as $Al_sIn_tP$, the values of the subscripts were set at S=T=0.5. The carrier concentration of the n-type AlInP layer 118 was adjusted to about $1\times10^{18}$ cm$^{-3}$ by doping with Se and its thickness was $5\times10^{-4}$ cm.

As in Example 3, an n-type GaAs layer 116 was deposited on the n-type AlInP layer 118.

An n-type electrode 111 was formed on the n-type GaAs layer 116 and a p-type electrode 112 was formed on the bottom surface of the p-type GaAs substrate 108. As in Example 3, this completed the fabrication of an LED for emitting green light. At the time of LED fabrication, all of the n-type GaAs layer 116 other than the part thereof immediately under the n-type electrode 111 was removed by etching so as to enable output of light from the AlGaInP active layer 117.

The LED emitted green light of a wavelength in the vicinity of 560 nm when a forward voltage was applied between the electrodes 111 and 112. In this LED comprising the heterojunction material according to the invention, the forward voltage required for producing a 5 mA operating current between the electrodes was not more than about 2.1 V. In contrast, a forward voltage of about 3 V was required for producing a 5 mA current from the p side electrode to the n side electrode of a prior art LED comprising an AlGaAs/AlInP heterojunction having no AlGaInPAs middle layer. The superiority of the semiconductor heterojunction material according to the invention was thus verified.

EXAMPLE 5

Figure 10:
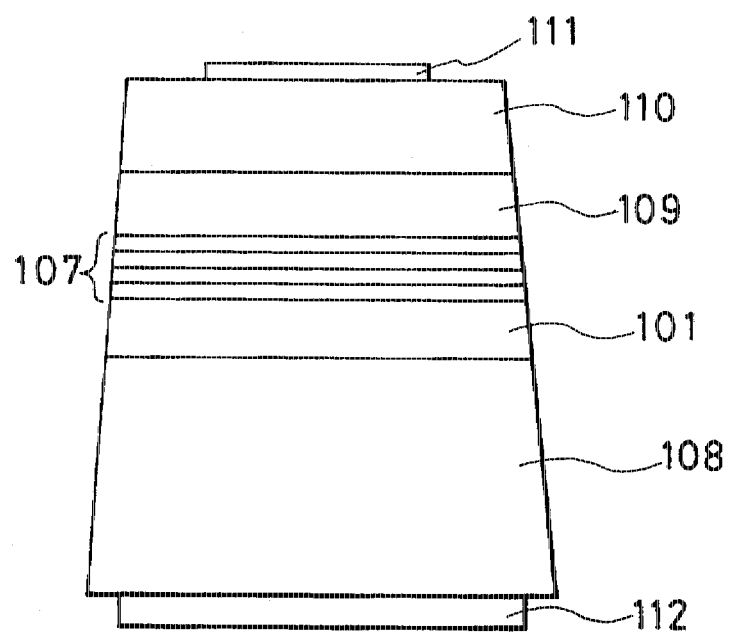
FIG. 10 is a schematic view of an LED comprising a semiconductor heterojunction material which is a fifth working example of the invention.

FIG. 10 shows an LED comprising a semiconductor heterojunction material which is a fifth working example of the invention. As shown in the schematic sectional view of FIG. 10, the heterojunction configuration was formed of GaAs and AlGaInP and had an intervening middle layer of AlGaInPAs.

The heterojunction material was formed on a p-type GaAs substrate 108 doped with Zn. The p-type GaAs substrate 108 was the same as that in Example 1. A Zn-doped p-type GaAs layer 101 was deposited on the p-type GaAs substrate 108 as a buffer layer. The p-type GaAs layer 101 was the same as in Example 1.

A p-type AlGaInPAs layer doped with Zn was formed on the p-type GaAs layer 101 as a middle layer 107. The middle layer was formed to a thickness of approximately $2\times10^{-5}$ cm. The carrier concentration of the middle layer 107 was held within the range of approximately $1\times10^{17}$ cm$^{-3}$ to approximately $2\times10^{18}$ cm$^{-3}$.

The middle layer 107 made of p-type AlGaInPAs was constituted of four sublayers whose compositions were graded stepwise. Representing the composition of the four sublayers constituting the middle layer 107 as $Al_xGa_yIn_zP_UAs_W$, the values of the subscripts were to set at X=0.05, Y=0.85, Z=0.1, U=0.2 and W=0.8 in the first sublayer as counted from the side nearest the GaAs substrate, at X=0.1, Y=0.7, Z=0.2, U=0.4 and W=0.6 in the second sublayer, at X=0.15, Y=0.55, Z=0.3, U=0.6 and W=0.4 in the third sublayer, and at X=0.2, Y=0.4, Z=0.4, U=0.8 and W=0.2 in the fourth sublayer. Each of the first to fourth sublayers contained all five elements of the GaAs and AlGaInP constituting the heterojunction. Each of the first to fourth sublayers had a thickness of around $5\times10^{-6}$ cm.

As in Example 1, a p-type AlGaInP light emitting layer 109 and an n-type AlGaInP layer 110 were deposited on the middle layer 107. In addition, an n-type electrode 111 and a p-type electrode 112 were formed as in Example 1, completing the fabrication of an LED for emitting green light.

The LED emitted green light of a wavelength in the vicinity of 560 nm when a forward voltage was applied between the electrodes 111 and 112. In this LED comprising the heterojunction material according to the invention, the forward voltage required for producing a 5 mA operating current between the electrodes was not more than about 2.5 V. In contrast, a forward voltage of about 8 V was required for producing a 5 mA current from the p side electrode to the n side electrode of a prior art LED comprising a GaAs/AlGaInP heterojunction having no AlGaInPAs middle layer. The superiority of the semiconductor heterojunction material according to the invention was thus verified.

As is clear from the foregoing explanation, the invention provides a semiconductor heterojunction material including a heterojunction configured by successively overlaying first, middle and third layers of semiconductors, wherein some or all of the constituent elements of the first and third layers are different and the middle layer contains all elements contained in the first and third layers. This configuration provides a semiconductor heterojunction material which suppresses increase in electrical resistance owing to occurrence of a heterobarrier at the heterojunction and can also be used to obtain a similar effect in heterojunctions made of materials other than those described in the foregoing, such as in the case where a middle layer of AlGaInPAs is provided in a heterojunction formed of AlGaAs and GaInP or where a middle layer of ZnCdSSe is provided in a heterojunction of ZnCdSe and CdSSe. Moreover, in the semiconductor heterojunction material in which the composition of the middle layer is graded stepwise or continuously in accordance with the invention, it also becomes possible to vary other properties such as the index of refraction in the region between the two types of semiconductors forming the heterojunction, either stepwise or continuously.

What is claimed is:

1. A semiconductor heterojunction material comprising a heterojunction configured by successively overlaying first, middle and third layers of semiconductors, the middle layer consisting of AlGaInPAs and the other two layers consisting of GaAs and AlGaInP, the middle layer having an impurity concentration within the range of approximately $1\times10^{17}$ cm$^{-3}$ and $2\times10^{18}$ cm$^{-3}$.

2. A semiconductor heterojunction material comprising a heterojunction configured by successively overlaying first, middle and third layers of semiconductors, the middle layer consisting of AlGaInPAs and the other two layers consisting of GaAs and AlInP, the middle layer having an impurity concentration within the range of approximately $1\times10^{17}$ cm$^{-3}$ and $2\times10^{18}$ cm$^{-3}$.

3. A semiconductor heterojunction material comprising a heterojunction configured by successively overlaying first, middle and third layers of semiconductors, the middle layer consisting of AlGaInPAs and the other two layers consisting of AlGaAs and AlGaInP, the middle layer having an impurity concentration within the range of approximately $1\times10^{17}$ cm$^{-3}$ and $2\times10^{18}$ cm$^{-3}$.

4. A semiconductor heterojunction material comprising a heterojunction configured by successively overlaying first, middle and third layers of semiconductors, the middle layer consisting of AlGaInPAs and the other two layers consisting of AlGaAs and AlInP, the middle layer having an impurity concentration within the range of approximately $1\times10^{17}$ cm$^{-3}$ and $2\times10^{18}$ cm$^{-3}$.

5. A semiconductor heterojunction material comprising a heterojunction configured by successively overlaying first, middle and third layers of semiconductors, the middle layer consisting of AlGaInPAs and the other two layers consisting of GaAs and AlGaInP, the middle layer being graded continuously or stepwise in elemental composition between its heterojunction interface with one of the first and third layers and its heterojunction interface with the other thereof.

6. A semiconductor heterojunction material comprising a heterojunction configured by successively overlaying first, middle and third layers of semiconductors, the middle layer consisting of AlGaInPAs and the other two layers consisting of GaAs and AlInP, the middle layer being graded continuously or stepwise in elemental composition between its heterojunction interface with one of the first and third layers and its heterojunction interface with the other thereof.

7. A semiconductor heterojunction material comprising a heterojunction configured by successively overlaying first, middle and third layers of semiconductors, the middle layer consisting of AlGaInPAs and the other two layers consisting of AlGaAs and AlGaInP, the middle layer being graded continuously or stepwise in elemental composition between its heterojunction interface with one of the first and third layers and its heterojunction interface with the other thereof.

8. A semiconductor heterojunction material comprising a heterojunction configured by successively overlaying first, middle and third layers of semiconductors, the middle layer consisting of AlGaInPAs and the other two layers consisting of AlGaAs and AlInP, the middle layer being graded continuously or stepwise in elemental composition between its heterojunction interface with one of the first and third layers and its heterojunction interface with the other thereof.

9. A semiconductor heterojunction material according to claim 5, wherein the middle layer has an impurity concentration within the range of approximately $1\times10^{17}$ cm$^{-3}$ and $2\times10^{18}$ cm$^{-3}$.

10. A semiconductor heterojunction material according to claim 6, wherein the middle layer has an impurity concentration within the range of approximately $1\times10^{17}$ cm$^{-3}$ and $2\times10^{18}$ cm$^{-3}$.

11. A semiconductor heterojunction material according to claim 7, wherein the middle layer has an impurity concentration within the range of approximately $1\times10^{17}$ cm$^{-3}$ and $2\times10^{18}$ cm$^{-3}$.

12. A semiconductor heterojunction material according to claim 8, wherein the middle layer has an impurity concentration within the range of approximately $1\times10^{17}$ cm$^{-3}$ and $2\times10^{18}$ cm$^{-3}$.

* * * * *